US012597464B2

(12) United States Patent
Noel et al.

(10) Patent No.: US 12,597,464 B2
(45) Date of Patent: Apr. 7, 2026

(54) SRAM WITH PUF DEDICATED SECTOR STANDING-BY

(71) Applicant: COMMISSARIAT À L'ÉNERGIE ATOMIQUE ET AUX ÉNERGIES ALTERNATIVES, Paris (FR)

(72) Inventors: Jean-Philippe Noel, Grenoble (FR); Merlin Gerbaud, Grenoble (FR); Bastien Giraud, Grenoble (FR); Lorenzo Ciampolini, Grenoble (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 170 days.

(21) Appl. No.: 18/544,789

(22) Filed: Dec. 19, 2023

(65) Prior Publication Data

US 2024/0203485 A1     Jun. 20, 2024

(30) Foreign Application Priority Data

Dec. 20, 2022     (FR) ...................................... 2214117

(51) Int. Cl.
*G11C 11/00* (2006.01)
*G11C 11/412* (2006.01)

(52) U.S. Cl.
CPC ................................. *G11C 11/4125* (2013.01)

(58) Field of Classification Search
CPC .................................................. G11C 11/4125
See application file for complete search history.

(56) References Cited

U.S. PATENT DOCUMENTS 8,767,445 B2 *  7/2014  Chellappa ............. G11C 11/413
                                                                         365/230.08
9,608,827 B1 *  3/2017  Trimberger .............. G11C 7/12
2006/0023521 A1  2/2006  Gabric et al.
(Continued)

FOREIGN PATENT DOCUMENTS

FR          3074604 A1    6/2019
FR          3128570 A1    4/2023

OTHER PUBLICATIONS

S. Kumar et al, "Impact of NBTI on SRAM Read Stability and Design for Reliability", ISQED 2006.
(Continued)

*Primary Examiner* — Min Huang
(74) *Attorney, Agent, or Firm* — McDonald Hopkins LLC

(57) ABSTRACT

A static random access memory device comprising a memory array provided with SRAM memory cells, each of said cells in said array comprising a first storage node and a second storage node, the device further being provided with a control circuit for controlling said cells configured to, after powering up the array, place the array into a first operating mode in which a first set of cells located in a first zone of the array into a so-called "metastable" state for which the first storage node and said second storage node are placed to equal or substantially equal potentials while a second set of cells located in a second zone of the array distinct from the first zone have their respective first node and second node to respective different potentials and corresponding to a given logic state between a low state and a high state and to a logic state complementary to said given state.

13 Claims, 5 Drawing Sheets

(56)                    References Cited

U.S. PATENT DOCUMENTS

2020/0014547 A1\*    1/2020   Lu ............................ H04L 9/12

OTHER PUBLICATIONS

J. Mcmahan et al, "Challenging On-Chip SRAM Security with Boot-State Statistics", HOST 2017.
W.-G. Ho et al, "A Secure Data-Toggling SRAM for Confidential Data Protection", IEEE TCAS-I 2019.
Preliminary Search Report for French Patent Application No. 2214117 dated Jul. 11, 2023.

\* cited by examiner

SRAM WITH PUF DEDICATED SECTOR STANDING-BY

CROSS-REFERENCE TO RELATED APPLICATIONS

This application claims priority from French Patent Application No. FR2214117 filed on Dec. 21, 2022. The content of this application is incorporated herein by reference in its entirety.

TECHNICAL FIELD

The present invention relates to memories, in particular of the SRAM ("Static Random Access Memory") type, and introduces means for controlling a memory in order to place at least one given sector of cells of this memory into a particular operating mode, while in other sectors the cells are freely accessible for reading.

STATE OF PRIOR ART

Transistors using PMOS technology are subject to a physical phenomenon referred to as NBTI (Negative-Bias Temperature Instability), which has the effect of increasing their threshold voltage, all the more so when their dimensions are reduced. This phenomenon is accelerated when the temperature and/or the negative voltage VGS applied between the gate and the source of the transistor increase.

An SRAM memory cell is commonly equipped with two inverters connected in a crossed head-to-tail fashion, each formed especially by a first P-type transistor and a second N-type transistor.

The value stored in an SRAM memory cell will influence the PMOS transistors of a memory cell differently and the VTP1/VTP2 ratio of the respective threshold voltages of both PMOSs will change over time in one direction or the other depending on the stored value.

Thus, the NBTI phenomenon influences probability of an SRAM cell spontaneously initialising when it is powered up to logic level '1' or to its opposite level '0', given that the logic initialisation level is related to the VTP1/VTP2 ratio.

But memory data from the initialisation of SRAM cells can be used to generate encryption keys or a unique hardware identifier or digital fingerprint. They can be used to create a Physically Unclonable Function (PUF).

In particular, some cells with a high VTP1/VTP2 ratio can be identified as being sufficiently stable to be used to form a PUF during a so-called enrolment phase. However, due to the effects of the aforementioned NBTI phenomenon, the VTP1/VTP2 ratio may be modified over time, making the cells less suitable for use in creating a PUF, one of the prerequisites of which is long-term temporal stability. To limit such degradation of SRAM cells over time, one technique consists in regularly inverting the contents of horizontal rows of memory cells. Such a technique leads to an increase in power consumption and is detrimental in terms of the time the system can access the memory cells. Bit inversion techniques are presented in document "*Impact of NBTI on SRAM Read Stability and Design for Reliability*", by S. Kumar et al, ISQED 2006 or in document "*A Secure Data-Toggling SRAM for Confidential Data Protection*", by W. G. Ho et al, IEEE TCAS-I 2019. In the latter document, the solution provided has the drawback of modifying the cell structure by adding extra transistors. In all cases, the periodic inversion of bits results in a loss of time and energy for the memory-using circuit.

A problem associated with effects of NBTI is the so-called "data imprint effect". Such an effect is described in document: "*Challenging On-Chip SRAM Security with Boot-State Statistics*", by J. McMahan et al, HOST 2017. When a piece of data stored in memory remains there for a long time, and moreover in a state of electrical overload, the threshold voltage VTP of the PMOS transistor being on changes, due to the same physical effect that causes NBTI. A harmful remanence or "data imprint" effect means that it may be possible to retrieve a piece of data that has been stored previously, even when the memory is reset.

The problem arises of making a memory device that is improved with respect to at least one of the problems discussed above.

DESCRIPTION OF THE INVENTION

One embodiment of the present invention provides a static random access memory device comprising a memory array provided with SRAM memory cells, each of said cells of said array comprising a first storage node and a second storage node, the device being further provided with a control circuit for controlling said cells configured to, after power-up of the array, place the array into a first operating mode in which a first set of cells located in a first zone of the array is in a so-called "metastable" undetermined state for which their respective first storage node and second storage node are placed at equal or substantially equal potentials while a second set of cells located in a second zone of the array distinct from the first zone are in a determined state in which, following an initialisation or write operation, their respective first node and second node are at respective potentials different between a low state, corresponding in particular to a given logic state '0', and a high state, corresponding to a complementary logic state '1', allowing in particular the storage of a value by the cells of this second zone.

By placing the cells into a metastable state, the harmful effects of NBTI are avoided.

Such an operating mode is particularly advantageous when the first set of cells contains a physically unclonable function (PUF). By placing the cells dedicated to PUFs into a metastable state, any possible drift in their initialisation state is avoided, thus preventing any key or digital signature associated with these cells from being falsified.

Advantageously, subsequent to power-up of the array, at least one gate or conductive line is connected to a supply potential.

The control circuit may be provided with at least one switch element able to connect or disconnect alternately a power supply line of cells of said first set to said gate or conductive line, and the cells are placed into the metastable state by disconnecting the power supply line from said gate or conductive line.

Thus, further to the fact of not being able to read their logic piece of data, the cells placed into a metastable state are prevented from untimely consuming.

Advantageously, the cells of the first set can be placed into said "metastable" state by connecting their respective first storage node and second storage node to each other.

According to one possibility of implementation, each cell of said first set may be provided with:
- a first inverter and a second inverter cross-connected between said first storage node and said second storage node, the first inverter and/or the second inverter being connected to a so-called "high" power supply line that can be placed to a supply potential, a first access transistor for access to the first storage node
and a second access transistor for access to the second
storage node, the first access transistor and the second
access transistor being connected to a first bit line and
a second bit line respectively,
the control circuit is provided with at least one switching
element able to connect together or disconnect from
each other alternately the first bit line and the second bit
line, the cells of the first set being placed into said
metastable state by said control circuit by activating the
access transistors and connecting together the first bit
line with the second bit line.

According to one embodiment, the device may further
comprise a module for producing a digital signature and/or
an encryption key from data stored in cells of said first set
of cells, said module being able to produce a signal request-
ing access to the first set of cells, the control circuit being
configured so as, following reception of said access request
signal, to place the cells of said first set of cells in a reading
accessibility state or in a state enabling an operation of
storing a value after an initialisation operation and in a
reading accessibility state, by:

disconnecting or isolating the first node from the second
node of each cell of the second set or,
applying a supply potential to the cells of the first set, or
isolating the first node from the second node of each cell
of the first set while applying a supply potential to the
cells of the first set.

Advantageously, to place the cells of said first set of cells
into a reading accessibility state, the cells of the first set can
be initialised beforehand by deactivating their first access
transistor and second access transistor while placing the high
power supply line at the supply potential in order to supply
their first inverter and their second inverter.

According to one possible implementation, the control
circuit can be configured to, when the cells of said first set
of cells are in a reading accessibility state, subsequent to
detection of a fraudulent access signal, place the first set of
cells located in a first zone of the array into said "meta-
stable" state.

BRIEF DESCRIPTION OF THE DRAWINGS

The present invention will be better understood upon
reading the description of exemplary embodiments given
purely by way of indicating and in no way limiting purposes,
with reference to the appended drawings in which.

Identical, similar or equivalent parts of the different
figures bear the same reference numerals so as to facilitate
switching from one figure to another.

The different parts represented in the figures are not
necessarily drawn to a uniform scale, to make the figures
more legible.

DETAILED DISCLOSURE OF PARTICULAR EMBODIMENTS

Figure 1:
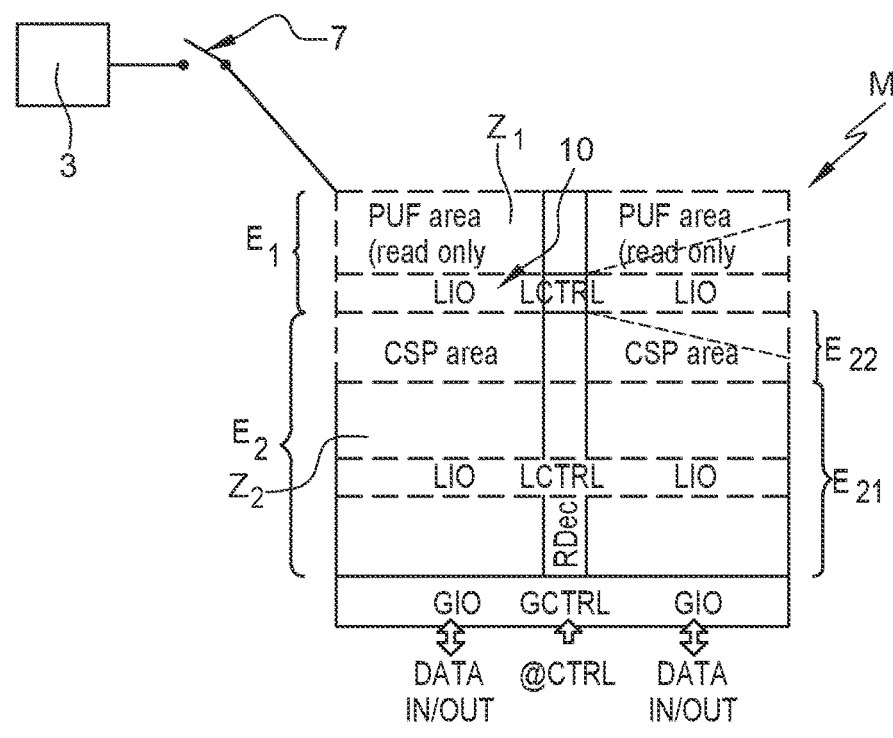
FIG. 1 illustrates an SRAM memory plane having a zone
formed by a set of cells likely to be placed into standby by
being placed into a metastable state while other zones of the
memory are freely accessible for reading.

A memory plane is schematically represented in FIG. 1
and comprises an array M of memory cells. The array is
typically formed by a plurality of rows and columns of
SRAM cells (not represented in this figure).

There are two zones Z1, Z2 in the array M, each formed
by a set of cells.

In particular, the memory includes a first set E1 of cells
located in a first zone Z1 of the array and which it is
particularly desired to protect from the NBTI phenomena
discussed above.

According to a particular embodiment, the first zone Z1
contains cells for performing a physically unclonable func-
tion (PUF) and whose logic state, in particular the initiali-
sation logic state, is likely to serve to form a digital signature
or a digital fingerprint of the memory.

To compensate for the NBTI and ageing phenomena, the
memory device is provided with a control circuit 10 con-
figured to, after switching on the array or while the array is
switched on and connected to a so-called "general" power
supply (schematically represented by a block 3), place the
first set E1 of the first zone of the array M1 into a particular
so-called "metastable" state in which the respective logic
state of the cells in this set cannot be distinguished.

The memory further includes a second set E2 located in
a second zone Z2 of the array which, when the first set E1
of the first zone of the array M1 is placed into a metastable
state, can in turn be placed into an operating mode in which
the cells are freely accessible for reading and writing. The
second set E2 occupies a second zone Z2 of the array, which
is typically larger in size than the first zone Z1.

The second set E2 can be formed by several sub-sets E21,
E22 and advantageously includes a sub-set E22 of cells that
can store sensitive CSP (Critical Security Parameters) data.

One way of placing a memory cell into said metastable
state is, for example, to connect its internal nodes $N_T$, $N_F$
together.

Figure 2:
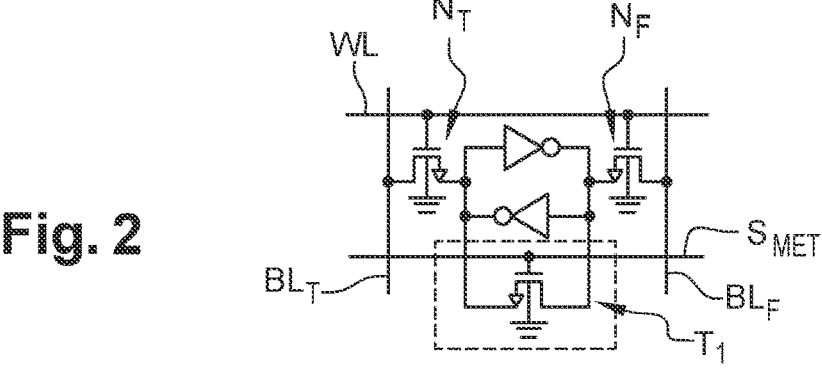
FIG. 2 illustrates a particular SRAM cell structure for
placing it into a metastable state by equalising its internal
nodes.

In the particular exemplary embodiment illustrated in
FIG. 2, this technique uses addition of a transistor T1 at the
memory cell, which alternately connects or disconnects the
internal nodes $N_T$, $N_F$ depending on the state of a signal
$S_{MET}$. When the internal nodes $N_T$, $N_F$ are equalised (tran-
sistor T1 turned on), the equivalent of an erase operation is
performed on the memory cell. If a read operation were to
be performed with the nodes connected in this way, there
would be approximately a 50% probability of reading a "1"
value and a 50% probability of reading a "0" value, and in
any case the value read no longer corresponds at all to the
value that may have been stored prior to the equalisation
operation. Transistor $T_1$ will be turned off after "erasing"
nodes $N_T$, $N_F$ in order to be able to "reset" the cell and return it to a configuration enabling it to be accessible again in the "normal" write and read mode.

It may be preferable to keep a conventional arrangement of the cells, without modifying their internal structure, especially in order to limit overall size. In this case, the "metastable" state can be achieved by other means as is set out hereinafter.

Figure 3:
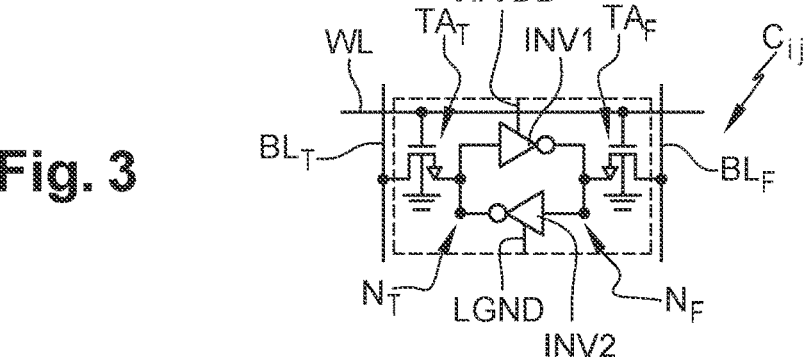
FIG. 3 illustrates an SRAM memory cell likely to be
integrated into a memory device according to the invention.

Thus, in FIG. 3, a conventional SRAM structure cell Cij is represented with its two storage nodes $N_T$ and $N_F$, configured to hold a first logic piece of information, and a logic piece of information complementary to the first piece of information. Keeping the logic information in the nodes is ensured by transistors forming self-looping inverters INV1, INV2. For example, when the SRAM cell is of the type commonly referred to as "6T" and is therefore formed by 6 transistors. The two inverters INV1, INV2 are typically formed by two load transistors and two conduction transistors. The inverters INV1, INV2 are connected to a first power supply line, in particular a so-called "high" VirVDD power supply line, and to a second power supply line LGND, in particular a so-called "low" power supply line.

The cell $C_{ij}$ receives supply via the high power supply line VirVDD when it is connected to a general power supply for the memory plane, for example placed to a potential VDD. Access to the storage nodes $N_T$ and $N_F$ is via two access transistors $TA_T$ and $TA_F$ respectively connected to bit lines $BL_T$ and $BL_F$ generally shared by the SRAM cells of a same column of cells of the array plane. This access to the storage nodes $N_T$ and $N_F$ is controlled by a word line WL generally shared by the SRAM cells of a same row of cells in the array plane. The access transistors $TA_T$ and $TA_F$ are thus configured so that, when they are activated (i.e. turned on), they allow access to the first node $N_T$ and the second node $N_F$, and when they are deactivated, they block access to the first node $N_T$ and the second node $N_F$ from the bit lines BLT and BLF.

Figure 4A:
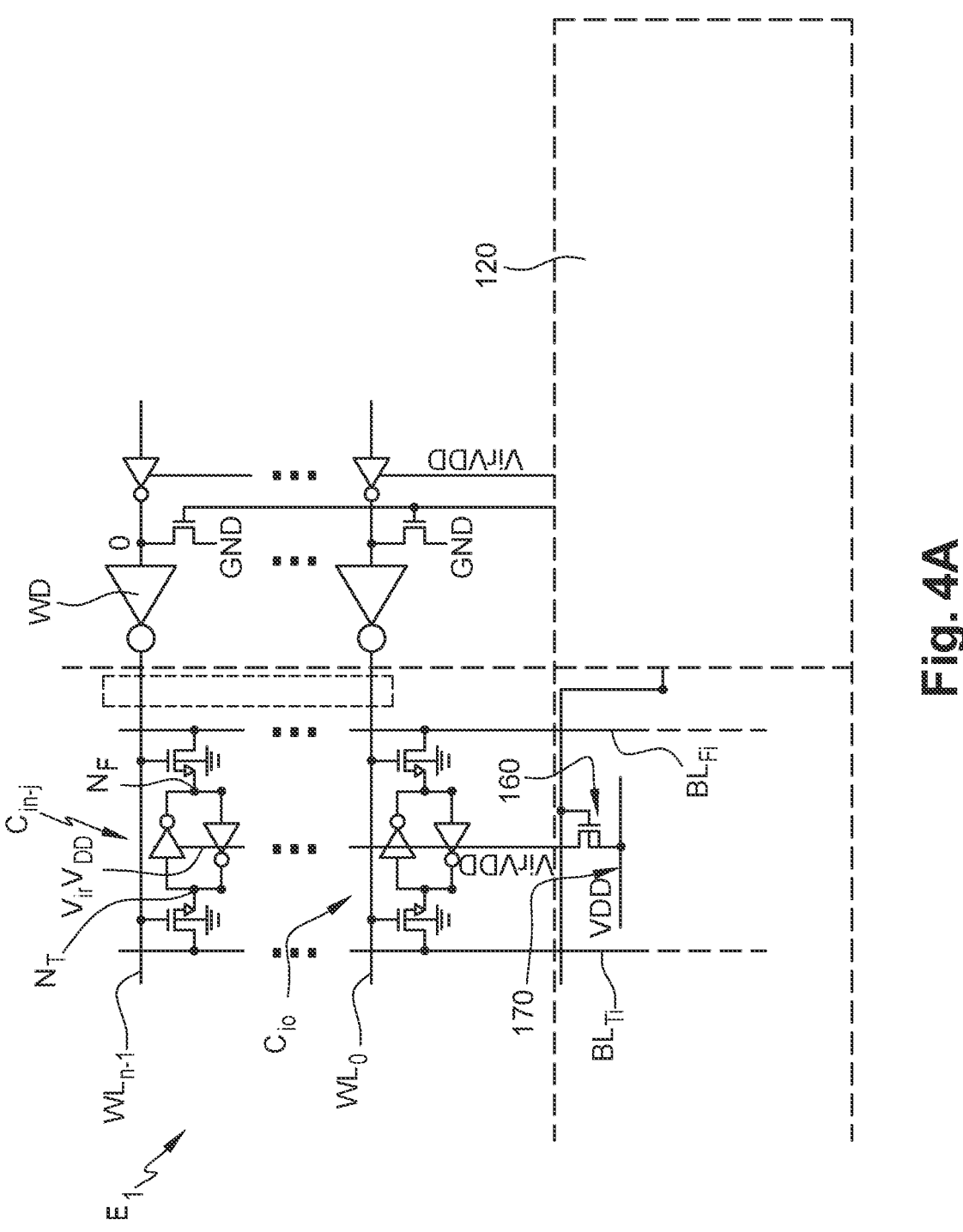
FIG. 4A illustrates a way of placing a conventionally
structured SRAM cell into a metastable state by disconnect-
ing its power supply from a power supply of the memory
plane.
Figure 4B:
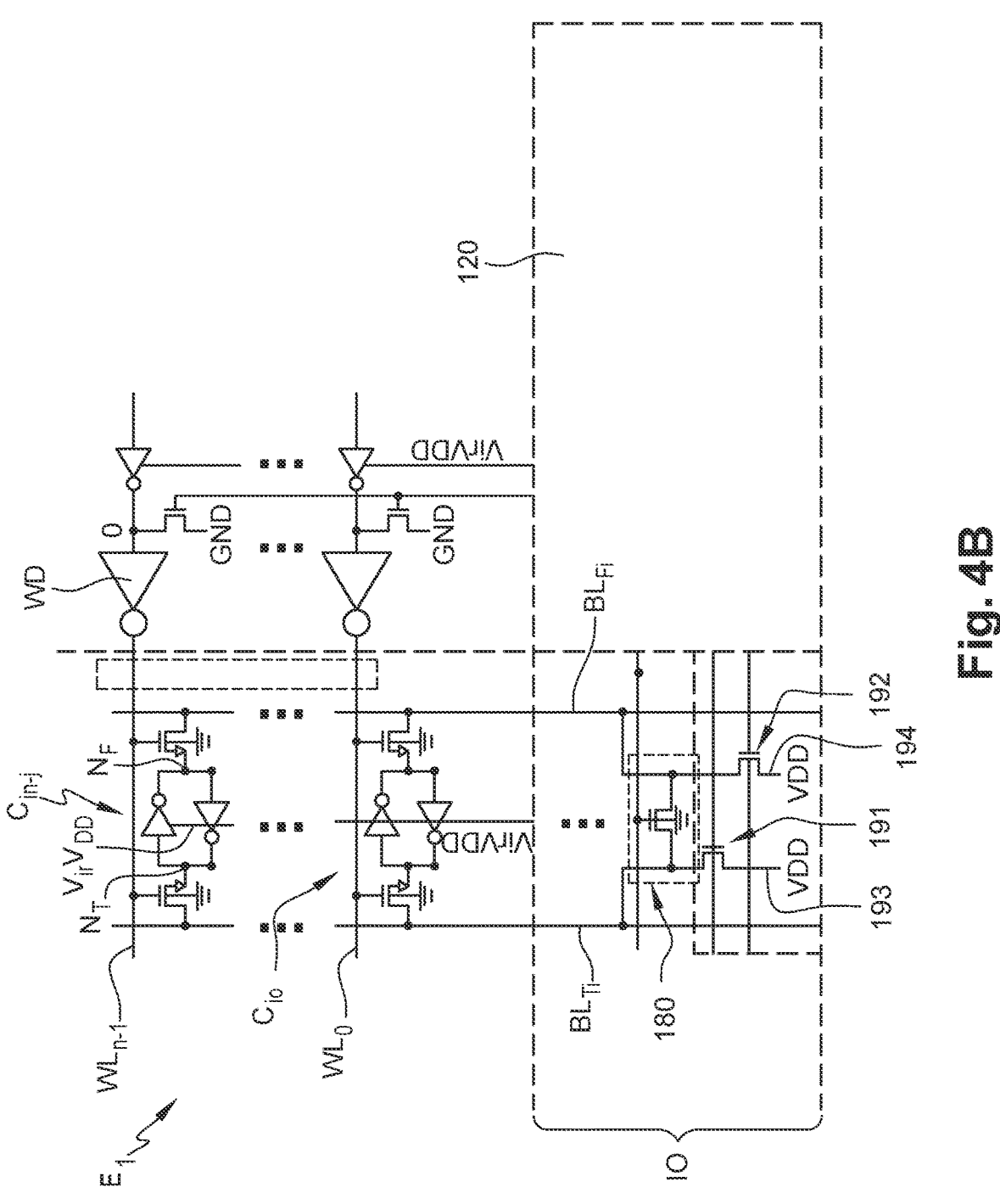
FIG. 4B illustrates a way of placing an SRAM cell in a
metastable state by equalising its internal nodes by connect-
ing together the bit lines to which this cell is connected.
Figure 4C:
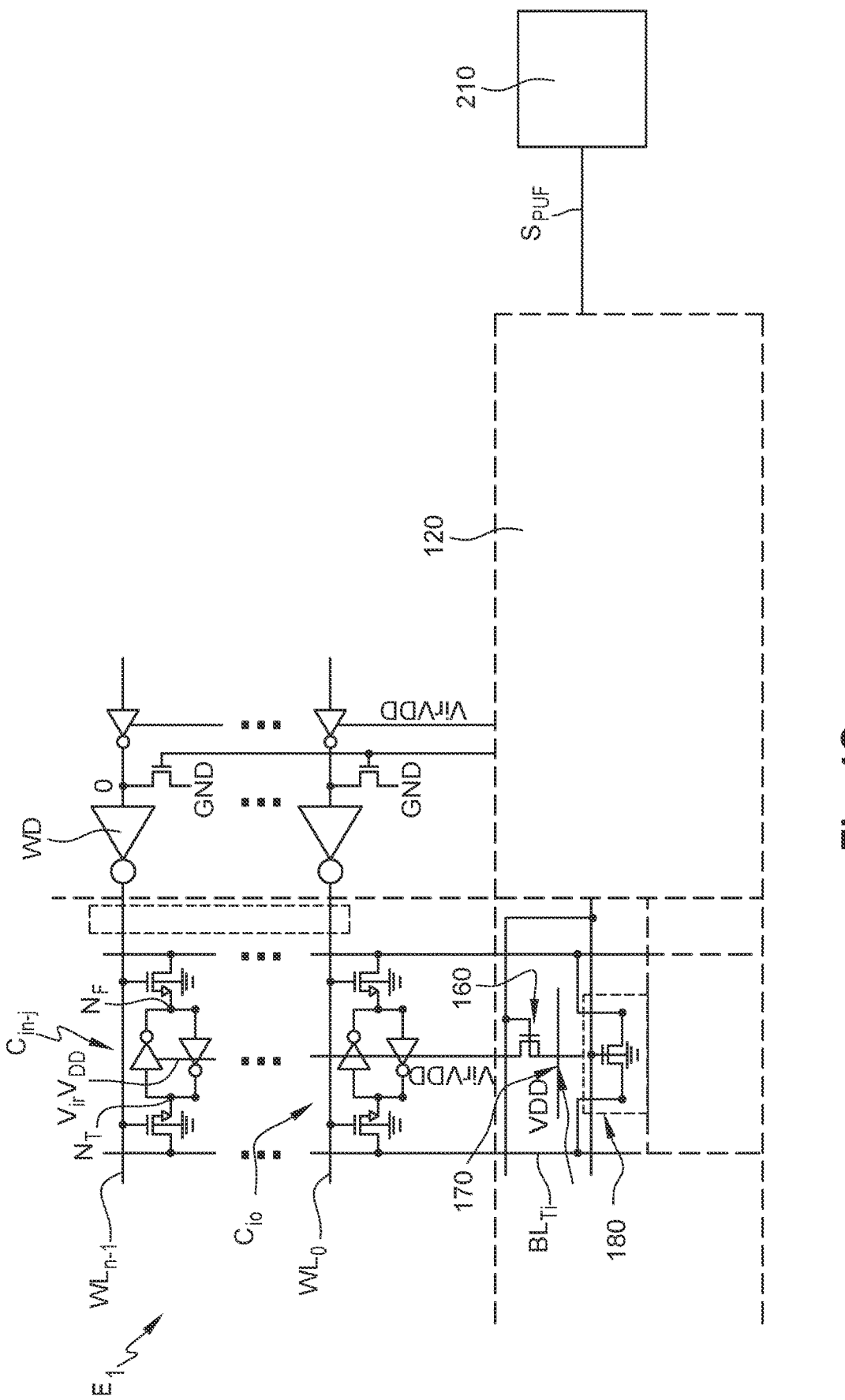
FIG. 4C illustrates a preferred alternative in which the
metastable state is obtained by equalising its internal nodes
and disconnecting its power supply from a power supply of
the memory plane.

Different ways of placing into a "metastable state" a first set E1 of cells whose internal structure is conventional and as previously described in connection with FIG. 3 are illustrated in FIGS. 4A-4C.

In order not to overload these figures, only one column of cells $Ci_{n-1}, \ldots Ci_0$ of the first set E1 is represented. The cells $Ci_{n-1}, \ldots Ci_0$ are here placed into a metastable state by disconnecting or leaving disconnected a high power supply line VirVDD of the memory cells.

In the example illustrated in FIG. 4A, a switch element 160, typically in the form of a transistor, in this example of the PMOS type, is disposed between the high power supply line VirVDD and the general power supply of the memory plane, for example conveyed by a gate or a power supply line 170 placed to a potential VDD.

Depending on the state of a control signal (not represented) issued by a control circuit 120, the switch element 160 is configured to connect or disconnect the high power supply line virVDD from the power supply 170. Disconnection is performed here when the transistor 160 is turned off. The first inverter INV1 and the second inverter INV2 are then not power supplied. The internal nodes $N_T$ and $N_F$ of the cells $Ci_{n-1}, \ldots Ci_0$ are then typically set to the same potential or substantially to the same potential, typically corresponding here to earth. By substantially at the same potential it is meant which differs by less than 10 mV.

In this case, too, the cells are in a metastable state so that it is not possible to distinguish any logical state by accessing the cell nodes.

Another way of placing the cells into a metastable state is to equalise the internal nodes $N_F$, $N_T$ of the memory cells.

In the particular exemplary embodiment illustrated in FIG. 4B, the equalisation of the nodes $N_F$, $N_T$ of the cells of the i-th column is achieved by connecting together the bit lines BLTi and BLFi and coupling the bit lines BLTi and BLFi to these nodes $N_F$, $N_T$ through the access transistors $TA_T$ and $TA_F$. In this example, the access transistors are thus activated (i.e. turned on) via the word lines $WL_0 \ldots WL_{n-1}$ to enable equalisation of the nodes $N_F$, $N_T$.

A switching element 180, formed for example by a transistor 180, here of the N-type, may be provided between the bit lines BLTi and BLFi.

Thus, depending on the state of a signal applied to the gate of this transistor 180, the bit lines BLTi and BLFi can alternately be connected together when it is desired to place into an operating mode in which the cells are placed into a metastable state, or to disconnect the bit lines BLTi and BLFi from each other to enable the nodes $N_F$, $N_T$ bit lines to respective values different from each other in another operating mode, for example where it is desired to read the data stored by the cells in the first set.

When the bit lines BLTi and BLFi are connected together, these bit lines BLTi and BLFi can also be isolated from bias lines 193, 194 connected, for example, placed to the potential VDD of a circuit peripheral to the memory plane and which can be located at one end of the column of cells, generally at the foot of the column. A switch element 191 is thus provided for alternately coupling or decoupling the first BLTi bit line and a first bias line 193. Similarly, a switch element 192 is provided for alternately coupling or decoupling the second bit line BLF and the second bias line 194. In the example illustrated, these switch elements are in the form of coupling transistors 191, 192 of the PMOS type, for example. The switch elements 191 and 192 can be used and possibly activated during an initialisation operation.

One preferred embodiment for placing the cells into a metastable state while limiting array consumption is illustrated in FIG. 4C.

In order to place the cells into a metastable state, it provides for both equalisation of the internal nodes $N_F$, $N_T$ (here when the switching element 180 is turned on) and keeping the cells without power supply (here when the switch element 160 is turned off). The device thus differs from that previously described in FIG. 4B in that the switch element 160 is additionally controlled so that it no longer supplies power to the cells when they are placed into the metastable state.

A control circuit 120 especially producing the signals for controlling the switches 160, 180 and for activating the transistors applied to the word lines $WL_0, \ldots, WL_{n-1}$ is schematically represented in FIGS. 4A-4C. It may be formed by a set of logic gates and may also include one or more flip-flops and/or multiplexer(s) and/or delay stage(s).

In the example illustrated in FIG. 4C, the circuit 120 is especially configured to receive as an input one or more signals from a PUF controller module 210. The PUF controller module 210 may be in the form of a dedicated digital circuit or in the form of a digital function performed by a processor. The transition from an operating mode in which the cells are in a metastable state to an operating mode in which the cells can be accessed for reading, and possibly for other operations, can be especially triggered by a signal $S_{PUF}$ requesting access to the first set E1 of cells.

Thus, when it is desired to access to memory identification or authentication data relating to the PUF (Physically Unclonable Function) serving as the digital signature or digital fingerprint of the memory, the PUF controller module 210 transmits the signal $S_{PUF}$ to the control circuit. This signal $S_{PUF}$ makes it possible to trigger various operations, especially including at least one free initialisation operation for the internal nodes of the cells of the first set E1 and possibly a biased initialisation as described below. During these initialisation operations, the internal nodes $N_T$, $N_F$ of the cells are established at distinct respective potentials, with the result that values are stored in memory in the PUF zone and it is possible to read them.

An initialisation phase therefore consists in transiting a memory cell from an "undetermined" (and therefore undeterminable by reading) or "metastable" state to a state with a "determined" (and therefore determinable by reading) stored value. An initialisation phase can be carried out when the memory device is powered up or following an erase operation triggered, for example, following detection of fraudulent access to the memory. Thus, reference may be made to a first patent application FR, No. 1761692, filed on Dec. 6, 2017 wherein a fast erase mechanism is described.

Reference may also be made to a second French patent application no. 2111286 filed by the applicant on Oct. 25, 2021 with the Institut National de la Propriété Intellectuelle wherein different initialisation mechanisms are described.

A so-called "free" initialisation mode consists in allowing each memory cell to initialise to its own value when the elements making up the memory cell are gradually powered up, especially the two looped-back inverters (see above in connection with FIGS. 2 and 3), without trying to impose a "0" or "1" value on internal nodes $N_T$ and $N_F$ of the cell. In the free initialisation mode, the access transistors $TA_T$ and $TA_F$ are firstly off, and the high power supply line VirVdd is placed to the supply potential Vdd in order to supply the first inverter and the second inverter.

In contrast, a so-called deterministic initialisation mode consists in imposing or forcing a value to be stored by the cell when it passes from an undetermined state to a determined state. To impose a value during initialisation, the memory device comprises, at the foot of the column, means for imposing a value on the internal nodes of the cells being initialised, via the bit lines and by turning on the access transistors of the cells concerned. In this second patent application, the initialisation value desired to be imposed may be "0" or "1". The deterministic initialisation means described in this second application, especially in connection with FIG. 4, make it possible to write all the memory cells to either "O" or "1". To do this, the device provides for driving, for each column, one of the bit lines $BL_T$ or $BL_F$ by connecting it to a supply voltage by switching on a bit line selection transistor. The bit line selected and supplied thus tends to impose a value "1" on one of the nodes of each memory cell connected to this bit line.

In this second patent application, a biased initialisation mode in connection with FIG. 6 is also described. In this biased initialisation mode, as for deterministic initialisation, a different bias is ensured between the first bit line BLT and the second bit line $BL_F$ while activating the access transistors $TA_T$ and $TA_F$ of the cells initialised. Instead of applying a voltage Vdd or Gnd to the bit lines $BL_T$ and $BL_F$ to "force" an initialisation value, a voltage Vdd is applied to one of the bit lines and Vdd-$\Delta$V is applied to the other bit line instead. Alternatively, a voltage Gnd can be applied to one of the bit lines and Gnd+$\Delta$V to the other bit line. Thus, in the biased initialisation mode, the only aim is to "unbalance" the memory cells by encouraging each memory cell to switch to a predefined stored value ("1" or "0"), but without surely forcing the memory cells to switch to this predefined state. The advantage of this biased initialisation mode is that it enables rapid detection of cells which naturally initialise (during free initialisation) to "1" or "0" with a high probability. Stated differently, if a cell has, for example, a high probability of initialising to "1" during a free initialisation, it will still be able to initialise to "1" during a biased initialisation which favours writing to "0", "resisting" the imbalance more than another memory cell which would have a lower probability of initialising to "1" during a free initialisation.

Figure 5:
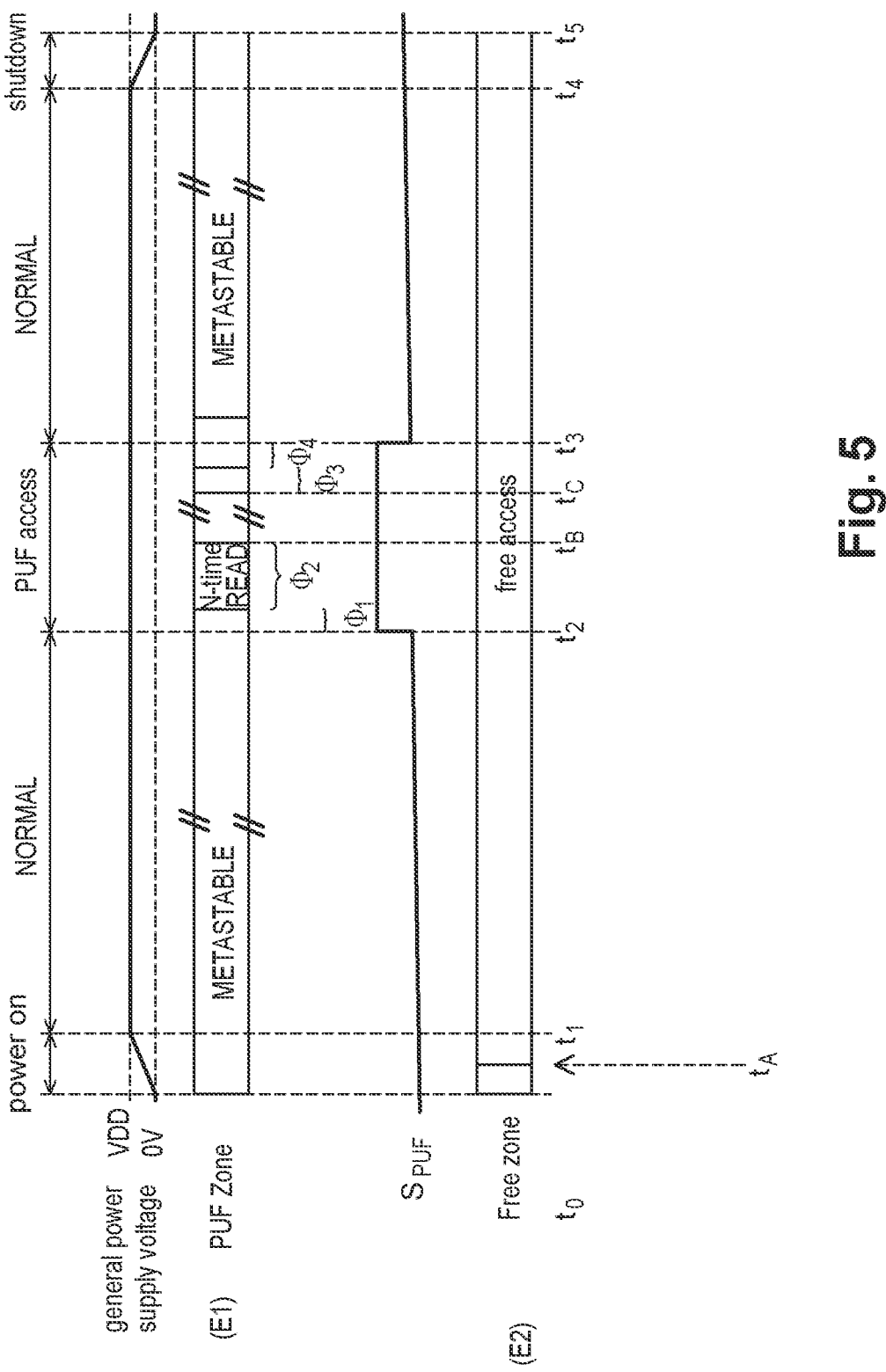
FIG. 5 gives an example of a time chart illustrating an
example of the operation of different zones of the memory
and an operating mode in which a particular sector of the
memory contains cells placed into a metastable state in order
to limit influence of the NBTI phenomenon while other
sectors are accessible for reading.

FIG. 5 shows an example of a time chart of operation for a memory device as described above. The time scale on this time chart is not represented linearly, the ratio of the durations respectively between instants t1 and t2 and between instants t2 and t3 typically being much greater than on this schematic representation.

When the array is powered up, for example when a gate or conductive line 170 changes from 0 to VDD between an instant t0 and an instant t1, the cells of the first set E1 are preferably kept to a metastable state. To do this, their high power supply line VirVdd is disconnected from this gate or conductive line 170 and/or their internal nodes $N_T$ and $N_F$ are connected to each other, for example by activating their access transistors $TA_T$ and $TA_F$ and connecting the bit lines BLTi, . . . , BLFi to each other via the switching element 180. The internal nodes $N_T$ and $N_F$ of the cells of the first set are then kept to equal or substantially equal potentials (i.e. at values which differ by less than 10 mV). A read circuit, for example equipped with a detection amplifier at the foot of the column, is thereby not likely to detect difference in potentials between the internal nodes $N_T$ and $N_F$ of the cells in the first set.

It is noted that initialisation of the cells to keep a metastable state of the cells during power-up (between t0 and t1) requires provision of a memory device control device ensuring the equivalent of a short-circuit between the internal nodes $N_T$ and $N_F$ of each of the cells. To do this, the memory device control circuit may use all or some of the "short-circuit" or "erase" means described in connection with FIGS. 2 to 4.

Alternatively, it is possible to allow the memory cells of set E1 to initialise freely, as is conventionally performed. According to another alternative, the memory cells of set E1 can be initialised, during this power-up phase (between t0 and t1), according to a deterministic initialisation mode, for example to place all the cells to "0" or "1".

Concomitantly, the cells of the second set E2 are supplied, thus with their high power supply line connected to the gate or conductive line 170. The cells in this set E2 will initialise according to the initialisation mode provided for power-up. For example, the cells of set E2 may be freely initialised by providing that the internal nodes of the cells of the second set are isolated from each other and are then established to different potentials from each other, so that a read circuit reading the cells after initialisation (after t1) is likely to detect difference in potentials between the internal nodes $N_T$ and $N_F$. Alternatively, it is possible for the initialisation of the cells of set E2 to be initialised to predefined values using a deterministic initialisation device for example such as that described in the second aforementioned application.

During a phase between an instant t1 and an instant t2, the device is in a so-called "normal" operating mode, which corresponds to a majority of the overall operating time of the array when it is supplied, for example at least 99% and in this example 99.9% of the time when the conductive supply gate is supplied and thus set to the supply voltage VDD. In this operating mode, the cells of the first set E1 are kept in their metastable state while the cells of the second set E2 are kept accessible for reading/writing, in particular as long as no fraudulent access is detected.

Then, from instant t2, another so-called "PUF access" phase is triggered. This phase can be triggered by the PUF controller module 210 which, by means of the $S_{PUF}$ signal which changes state, triggers the cells of the first set E1 to enter a second operating mode.

This second operating mode may in particular be an operating mode in which it is desired to access the cells of the first set in order to carry out an enrolment procedure to determine the cells desired to be used to create a digital signature and/or an encryption key (PUF), or in order to read a digital signature and/or an encryption key contained in some cells of this first set E1 (the enrolment procedure having already been carried out).

It is noted, as is known to those skilled in the art, that an enrolment procedure for searching for PUFs typically requires a large number of free initialisations of the PUF zone E1 to be carried out in order to establish a statistic for each cell establishing a probability of free initialisation to "1" or "0". Once this statistic has been established, a selection of cells is made to form the PUF by retaining the cells with the highest probabilities of initialising freely to "1" or "0".

As is described in the above-mentioned second patent application, the use of a biased initialisation speeds up this search and limits the number of initialisations required to establish the statistic.

Once the PUF has been established, after an enrolment procedure, it is possible to provide for a single interrogation of the PUF zone or even to request a "challenge" consisting, as is known to those skilled in the art, in making a free initialisation of the PUF zone and recovering the values of the previously identified cells in order to form the response to the challenge and deliver a secret value.

An example of the sequence of operations during an authorised PUF access, between instants t2 and t3, is described below in connection with FIG. 5. During this PUF access, the aim in this example is to carry out a PUF enrolment procedure.

For this PUF access, the cells of the first set E1 are initialised (phase @1), for example by performing a "free" initialisation. For this, the access transistors are turned off and the bit lines BLTi, . . . , BLFi are disconnected from each other via the switching element 180, which is turned off. The switch element 160 is turned on so as to connect the high power supply line VirVdd to the power supply gate. Alternatively, it may be provided that the first initialisation of the memory cells during a PUF access is carried out according to a deterministic access for security reasons.

During a phase $\Phi$2, the aim is to define the cells that will be retained to form the PUF in fine. Successive initialisation operations, either free or biased, as explained above are thereby performed. Between two initialisations, it is necessary to perform an erase operation using one of the erase methods described above.

During the PUF access phase, a fraudulent attempt to access the memory may be detected. A fraudulent access detection module may then be provided to transmit a fraudulent access detection signal to the control circuit, thereby triggering the cells to enter a metastable state again.

Such a fraudulent access detection module may have functions similar to those of a TAMP module present in an STM32GO microcontroller marketed by the company STMicroelectronics and described in the leaflet "STM32GO—TAMP, tamper and back-up registers, revision 1.0". Thus, between instants $t_B$ and $t_C$, the cells of the first set E1 can be placed once again into a metastable state by equalising its internal nodes and/or switching off their power supply.

If the signature search operation has not been completed and should be continued, the search process, comprising operations to initialise and erase the cells of the first set E1 (phase $\phi$3), is resumed.

A new change of state of the signal Spur transmitted by the PUF controller module 210 may, from an instant t3, enable a return to a "normal" operating mode in which the cells of the first set are once again placed into the metastable state. This change of state of the signal Spur occurs especially at the end of an enrolment operation or at the end of an "interrogation" or "challenge" operation of the PUF zone.

Apart from the times of authorised access to the PUF zone, the cells of the PUF memory are therefore kept in a metastable state in the present invention. The advantage of keeping the cells in a metastable state is that it eliminates, or at least greatly reduces, the previously described NBTI phenomenon. Thus, the PUF zone is protected against effects of ageing and its reliability is much greater and kept over time.

The invention claimed is:

1. A static random access memory device comprising a memory array provided with SRAM memory cells, each of said cells of said array comprising a first storage node and a second storage node, the static random access memory device being further provided with a control circuit for controlling said cells configured to, during a power-up phase of the array, place a first set of cells located in a first zone of the array in an undetermined so-called "metastable" state in which their respective first storage node and their second storage node are placed to equal or substantially equal potentials, while a second set of cells located in a second zone of the array distinct from the first zone are initialized in a determined state in which their respective first node and second node are at different respective potentials between a low state, corresponding in particular to a given logic state '0', and a high state, corresponding to a complementary logic state '1', then subsequent to this power-up phase, place the array into a first operating mode in which the first set of cells of the first zone is kept in the "metastable" state while the cells of the second zone are kept accessible for reading and writing.

2. The static random access memory device according to claim 1, wherein the first set of cells contains a physically unclonable function.

3. The static random access memory device according to claim 1, wherein subsequently to the power-up of the array, at least one gate or conductive line is placed to a supply potential and wherein the control circuit is provided with at least one switch element able to connect or disconnect alternately a power supply line of cells of said first set to said gate or conductive line, and wherein the cells are placed into the metastable state by disconnecting the power supply line from said gate or conductive line.

4. The static random access memory device according to claim 1, wherein the cells of the first set are placed into said "metastable" state by connecting their respective first and second storage nodes to each other.

5. The static random access memory device according to claim 1, wherein each cell of said first set is provided with:
   a first inverter and a second inverter cross-connected between said first storage node and said second storage node, the first inverter and/or the second inverter being connected to a so-called "high" power supply line that can be placed to a supply potential, a first access transistor for access to the first storage node and a second access transistor for access to the second storage node, the first access transistor and the second access transistor being respectively connected to a first bit line and to a second line, the control circuit is provided with at least one switching element able to connect together or disconnect from each other alternately the first bit line and the second bit line, the cells of the first set being placed into the so-called "metastable" state by said control circuit by activating the access transistors and connecting together the first bit line with the second bit line.

6. The static random access memory device according to claim 1, further comprising a module for producing a digital signature and/or an encryption key from data stored in cells of said first set of cells, said module being able to produce a signal requesting access to the first set of cells, the control circuit being configured to, subsequent to reception of said access request signal, place the cells of said first set of cells in a state enabling an operation of storing value after an initialization operation and in a reading accessibility state, by:

isolating the first node from the second node of each cell of the second set from each other or, applying a supply potential to the cells of the first set, or isolating the first node from the second node of each cell of the first set while applying a supply potential to the cells of the first set.

7. The static random access memory device according to claim 6, wherein the cells of said first set of cells are freely initialized by deactivating their first access transistor and second access transistor while placing the high power supply line to the supply potential in order to supply their first inverter and second inverter.

8. The static random access memory device according to claim 7, wherein the control circuit is configured to, subsequent to a detection of a fraudulent access signal, place or place back the first set of cells situated in a first zone of the array into said metastable state.

9. The static random access memory device according to claim 1, further comprising a fraudulent access detection module provided for transmitting a fraudulent access detection signal to the control circuit and wherein, in the first operating mode, the cells of the second set are kept accessible for reading and writing as long as no fraudulent access detection signal is detected.

10. The static random access memory device according to claim 1, wherein the second set of cells contains a subset of cells in which sensitive data are stored or able to be stored.

11. A method for controlling a static random access memory device according to claim 1, comprising the steps of:

powering up the array, placing the array into the first operating mode, and then, reading a digital signature and/or an encryption key contained in some cells of said first set of cells.

12. The control method according to claim 11, wherein reading the digital signature or the encryption key comprises a phase referred to as the "PUF access phase", the method further comprising, subsequent to detection of an attempt at fraudulent access to the memory during said PUF access phase, a step of:

placing the cells of the first set back into said metastable state.

13. The control method according to claim 11, in the first operating mode of the cells of the first set wherein the cells of the first set are in said metastable state is maintained as long as reading a digital signature and/or an encryption key is not performed.

* * * * *